United States Patent
Worledge (10) Patent No.: US 9,691,463 B1
(45) Date of Patent: Jun. 27, 2017

(54) SPIN HALL EFFECT MRAM WITH SELF-REFERENCE READ

(71) Applicant: International Business Machines Corporation, Armonk, NY (US)

(72) Inventor: Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/145,364

(22) Filed: May 3, 2016

(51) Int. Cl.
| | | |
|---|---|---|
| *G11C 11/16* | (2006.01) | |
| *H01L 27/22* | (2006.01) | |
| *H01L 43/04* | (2006.01) | |
| *H01L 43/10* | (2006.01) | |
| *H01L 43/06* | (2006.01) | |

(52) U.S. Cl.
CPC ........ *G11C 11/1675* (2013.01); *G11C 11/161* (2013.01); *G11C 11/1673* (2013.01); *H01L 27/228* (2013.01); *H01L 43/04* (2013.01); *H01L 43/065* (2013.01); *H01L 43/10* (2013.01)

(58) Field of Classification Search
CPC ................................ G11C 11/16; G11C 11/18
USPC ................................................ 365/158, 171
See application file for complete search history.

(56) References Cited

U.S. PATENT DOCUMENTS

| | | | |
|---|---|---|---|
| 7,323,732 B2 * | 1/2008 | Ho | ........................... G11C 11/16 257/295 |
| 7,433,225 B2 | 10/2008 | Worledge | |
| 7,813,168 B2 | 10/2010 | Zhu et al. | |
| 7,948,813 B2 | 5/2011 | Abe | |
| 8,358,534 B2 * | 1/2013 | Kramer | ................. H01L 27/228 257/295 |
| 8,493,776 B1 | 7/2013 | Yu et al. | |
| 8,750,033 B2 | 6/2014 | Worledge | |
| 8,796,045 B2 | 8/2014 | Worledge | |
| 9,058,884 B2 | 6/2015 | Ueda | |
| 9,236,105 B2 * | 1/2016 | Pi | ........................ G11C 11/1675 |
| 2014/0264511 A1 | 9/2014 | De Brosse et al. | |
| 2014/0269036 A1 * | 9/2014 | Pi | ........................ G11C 11/1675 365/158 |
| 2014/0301135 A1 | 10/2014 | Guo | |
| 2015/0089120 A1 | 3/2015 | Pangal et al. | |
| 2016/0079518 A1 * | 3/2016 | Pi | ........................... H01L 43/08 257/421 |

OTHER PUBLICATIONS

Worledge et al., "Spin torque switching of perpendicular Ta|CoFeB|MgO-based magnetic tunnel junctions," Applied Physics Letters 98, 022501 (Jan. 2011) (3 pages).

(Continued)

*Primary Examiner* — Son Mai
(74) *Attorney, Agent, or Firm* — Vazken Alexanian; Michael J. Chang, LLC (57) ABSTRACT

Techniques for writing magnetic random access memory (MRAM) using the spin hall effect with a self-reference read are provided. In one aspect, an MRAM device is provided. The MRAM device includes: a plurality of first spin hall wires oriented orthogonal to a plurality of second spin hall wires; a plurality of magnetic memory cells configured in an array between the first spin hall wires and the second spin hall wires; and a plurality of transistors connected to the magnetic memory cells by the first spin hall wires. Methods of operating an MRAM device are also provided.

18 Claims, 7 Drawing Sheets

(56) References Cited

OTHER PUBLICATIONS

Chen et al., "A 130 nm 1.2 V/3.3 V 16 Kb Spin-Transfer Torque Random Access Memory with Nondestructive Self-Reference Sensing Scheme," IEEE Journal of Solid-State Circuits, vol. 47, No. 2, Feb. 2012, pp. 560-573.

W.S. Zhao et al., "Failure and reliability analysis of STT-MRAM," Microelectronics Reliability, vol. 52, No. 9, Jul. 2012, pp. 1848-1852.

\* cited by examiner

Bottom Layers

FIG. 14

○ Via to M3
▨ M2 (shown at half width)
▥ M1
▦ Gate poly

FIG. 15

Top Layers

SPIN HALL EFFECT MRAM WITH SELF-REFERENCE READ

FIELD OF THE INVENTION

The present invention relates to magnetic random access memory (MRAM), and more particularly, to techniques for writing MRAM using the spin hall effect with a self-reference read.

BACKGROUND OF THE INVENTION

With spin torque MRAM devices, spin polarized electrons are used to switch the orientation of magnetic layers. The amount of current needed to write spin torque MRAM is however high, and therefore not practical for some applications.

Proposed solutions have involved using the spin hall effect to generate spin current. With the spin hall effect, the spin current is generated in a transverse direction while a charge current flows in a longitudinal direction. While the spin hall effect can provide an effective mechanism for writing spin torque MRAM, these proposed devices employ three terminals where the tunneling current across the magnetic tunnel junction and the current that generates the spin hall effect torque are applied across different pairs of terminals. This requires two transistors per unit cell, thus increasing the cell area.

Thus, improved spin torque MRAM devices would be desirable.

SUMMARY OF THE INVENTION

The present invention provides techniques for writing magnetic random access memory (MRAM) using the spin hall effect with a self-reference read. In one aspect of the invention, an MRAM device is provided. The MRAM device includes: a plurality of first spin hall wires oriented orthogonal to a plurality of second spin hall wires; a plurality of magnetic memory cells configured in an array between the first spin hall wires and the second spin hall wires; and a plurality of transistors connected to the magnetic memory cells by the first spin hall wires.

In another aspect of the invention, a method of operating an MRAM device is provided. The method includes the steps of: providing the MRAM device having a plurality of first spin hall wires oriented orthogonal to a plurality of second spin hall wires, a plurality of magnetic memory cells configured in an array between the first spin hall wires and the second spin hall wires, and a plurality of transistors connected to the magnetic memory cells by the first spin hall wires, wherein the magnetic memory cells comprise storage layers, sense layers, and tunnel barriers separating the storage layers and the sense layers; applying an electrical bias to one of the first spin hall wires to select a given column of the array; measuring, at a first instance, a read current from the selected column; writing the sense layers of the magnetic memory cells in a given row of the array to a known state by applying a spin hall current to one of the second spin hall wires; measuring, at a second instance after the writing step, the read current from the selected column; and comparing the read current measured at the first instance and at the second instance to determine whether a given one of the magnetic memory cells at an intersection of the selected column and the selected row has changed states.

In yet another aspect of the invention, another method of operating an MRAM device is provided. The method includes the steps of: providing the MRAM device having a plurality of first spin hall wires oriented orthogonal to a plurality of second spin hall wires, a plurality of magnetic memory cells configured in an array between the first spin hall wires and the second spin hall wires, and a plurality of transistors connected to the magnetic memory cells by the first spin hall wires, wherein the magnetic memory cells comprise storage layers, reference layers, and tunnel barriers separating the storage layers and the reference layers; applying an electrical bias to one of the first spin hall wires to select a given column of the array; measuring, at a first instance, a read current from the selected column; writing the storage layers of the magnetic memory cells in a given row of the array to a known state by applying a spin hall current to one of the first spin hall wires; measuring, at a second instance after the writing step, the read current from the selected column; comparing the read current measured at the first instance and at the second instance to determine whether a given one of the magnetic memory cells at an intersection of the selected column and the selected row has changed states; and rewriting the given magnetic memory cell back to an original state if the given magnetic memory cell has changed states.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for writing spin torque MRAM using the spin hall effect with a self-reference read which is accomplished using two spin hall wires, one above and one below the tunnel junction. One spin hall wire is used to write the storage layer, using transistors to access only that device. This, however, creates a mesh of interconnected devices, making it hard to read using conventional techniques. This is where the second spin hall wire comes into play. The second spin hall wire is used to write the sense layer during reading, allowing for a self reference read.

MRAM devices use magnetic memory cells to store information. In general, each magnetic memory cell includes a magnetic tunnel junction (or tunnel junction (TJ) for short) which includes magnetic metal layers separated by a tunnel barrier. In a traditional configuration, the magnetic orientation of the magnetic metal layer(s) on one side of the tunnel barrier is fixed, while the magnetic orientation of the magnetic metal layer(s) on the opposite side of the tunnel barrier can be switched. These magnetic metal layers are often referred to as the "fixed" and "free" layers of the tunnel junction, respectively. Information is stored in the magnetic memory cell as the magnetic orientation of the free layer relative to the fixed layer. For instance, the orientation of the free layer may be either parallel or anti-parallel to the orientation of the fixed layer. A traditional magnetic memory cell configuration is described in detail, for example, in U.S. Pat. No. 7,433,225 issued to Worledge, entitled "Scalable Magnetic Random Access Memory Device," the contents of which are incorporated by reference as if fully set forth herein.

With spin torque MRAM, the TJ consists of a storage layer and a soft reference layer (also referred to herein as a sense layer) which replaces the standard fixed layer of the conventional design. Spin torque MRAM is described, for example, in Worledge et al., "Spin torque switching of perpendicular Ta|CoFeB|MgO-based magnetic tunnel junctions," Applied Physics Letters 98, 022501 (January 2011) (hereinafter "Worledge"), the contents of which are incorporated by reference as if fully set forth herein. In the same manner as described above, information is stored in the magnetic memory cell based on a magnetic orientation of the storage layer relative to the sense layer. For instance, the orientation of the storage layer may be either parallel or anti-parallel to the orientation of the sense layer.

Figures 1, 2:
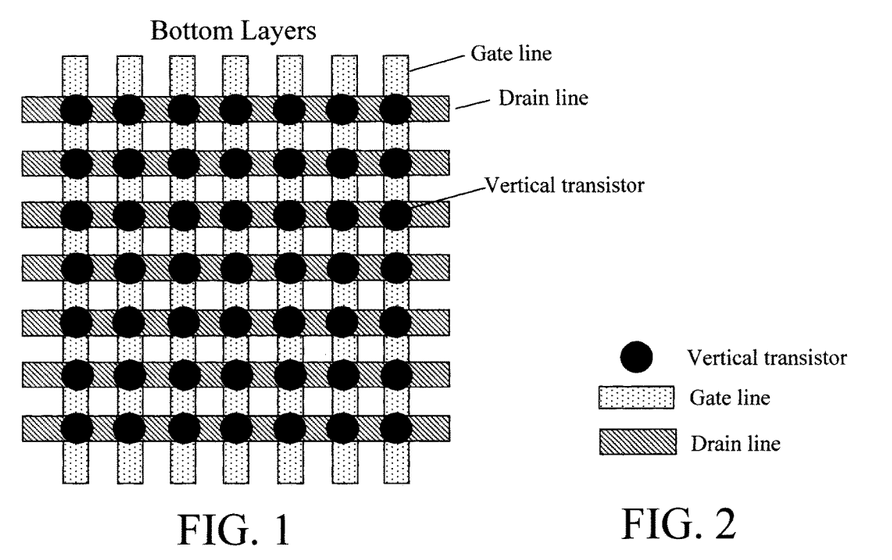
FIG. 1 is a top-down diagram illustrating bottom layers of an MRAM device according to an embodiment of the present invention.
FIG. 2 provides a figure legend for the structures shown in FIG. 1 according to an embodiment of the present invention.
Figures 3, 4:
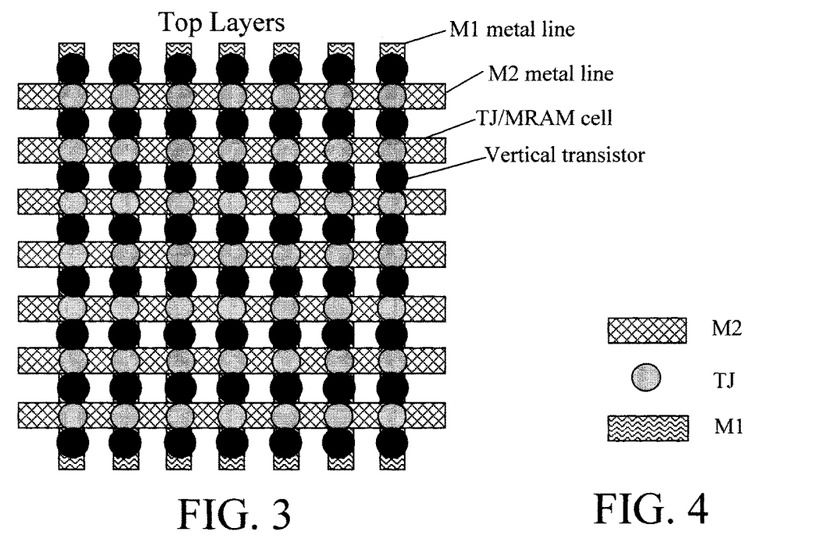
FIG. 3 is a top-down diagram illustrating top layers of the MRAM device according to an embodiment of the present invention.
FIG. 4 provides a figure legend for the structures shown in FIG. 3 according to an embodiment of the present invention.

Referring to FIGS. 1 and 2 (bottom layers) and FIGS. 3 and 4 (top layers) an exemplary MRAM device is shown which employs a vertical transistor configuration. As will be described in conjunction with the description of FIG. 5 (cross-section) below, each vertical transistor includes a gate on top of a drain, and a source on top of the gate. The layout of the vertical transistors (i.e., offset relative to the TJs) is such that each MRAM cell in the device can be individually selected.

As shown in FIG. 1, the bottom layers of the MRAM device include a plurality of drain lines orthogonal to a plurality of gate lines. A vertical transistor is present at each intersection of the drain lines and the gate lines. As shown in FIG. 2, the gate lines are present over the drain lines, and the vertical transistors are present over the gate lines (at each intersection with the drain line).

FIG. 3 illustrates how the top layers of the MRAM device include a plurality of (first) M1 metal lines orthogonal to a plurality of (second) M2 metal lines. Tunnel junctions (TJs) are present between the M1 and M2 metal lines, i.e., at each intersection of the M1 and M2 metal lines. As shown in FIG. 3, the intersections of the M1 and M2 metal lines are offset from the intersections of the gate and drain lines (see FIG. 1). As a result, this offsets the positioning of the vertical transistors (at the intersections of the gate and drain lines) relative to the TJs (at the intersections of the M1 and M2 metal lines). As highlighted above, this offset design permits the exclusive selection of individual MRAM cells in the device. As shown in FIG. 4, the TJs are present between M1 and M2 metal lines.

Figure 5:
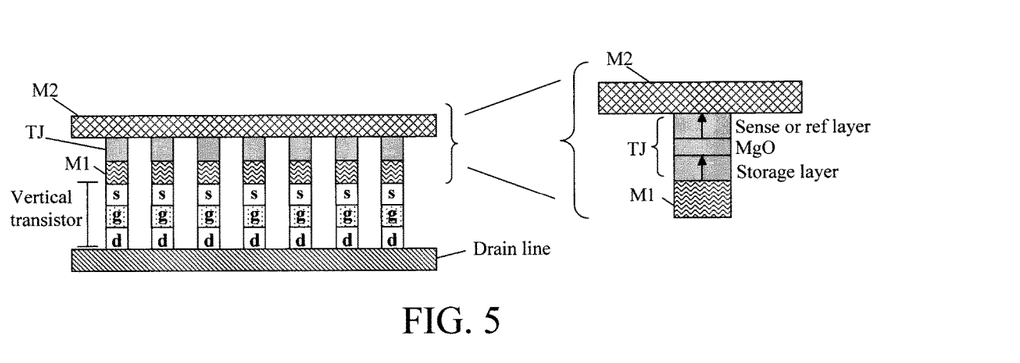
FIG. 5 is a cross-sectional view of the MRAM device according to an embodiment of the present invention.

FIG. 5 illustrates the MRAM device in cross-section. As shown in FIG. 5, each of the vertical transistors includes a drain (on the drain line), a gate on the drain, and a source on the gate. The TJs over the transistors are sandwiched between the M1 and M2 metal lines. As will be described in detail below, the TJs include a storage layer and a sense layer, and the M1 and M2 metal lines are the spin hall wires below and above the tunnel junctions which are used to write the storage and sense layers, respectively. Alternatively, as indicated in FIG. 5, the present techniques can also be implemented using a traditional TJ having a storage layer (as a "free" layer) and a pinned reference "ref" layer (as a "fixed" layer). This exemplary implementation using a traditional TJ will be described in detail below.

An expanded view of the top layers is provided in FIG. 5. As shown in the expanded view, the TJ in this example includes a storage layer (bottom layer) and a sense or reference layer (top layer) separated by a tunnel barrier. In this example, the tunnel barrier is magnesium oxide (MgO). However, other tunneling barrier materials may be similarly employed. As provided above, information is stored in the TJs based on the magnetic orientation of the sense layer, either up or down. In a zero applied magnetic field, a fringe magnetic field from the storage layer aligns the sense layer and the storage layer in a parallel state. Resistance is low in a parallel state. Switching the magnetic orientation of the sense layer (e.g., via the M2 metal line) such that the sense layer and the storage layer are in an anti-parallel state (such as during a self reference read—see below) increases the resistance of the TJ.

Writing data to the magnetic memory cells is a straight-forward process. As provided above, the vertical transistors are offset from the TJs and thus any cell in the array can be selected via a given two of the transistors. On the other hand, readout from the cells is a much more complicated task. Namely, since the TJs are all connected in parallel one cannot simply read the resistance through only one TJ, i.e., current cannot be directed through a specific TJ.

Figure 6:
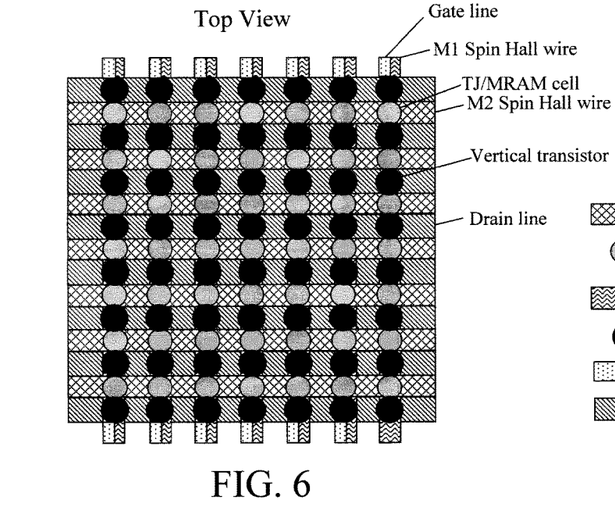
FIG. 6 is a top-down diagram illustrating an MRAM device having two spin hall wires, one above and one below the tunnel junction according to an embodiment of the present invention.
Figure 7:
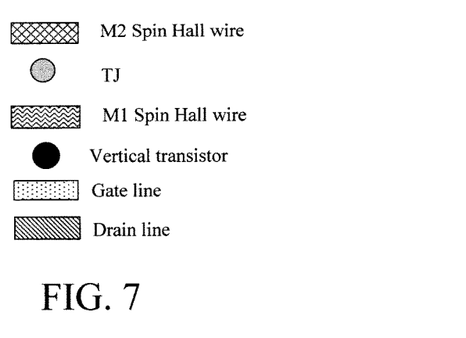
FIG. 7 provides a figure legend for the structures shown in FIG. 6 according to an embodiment of the present invention.
Figure 8:
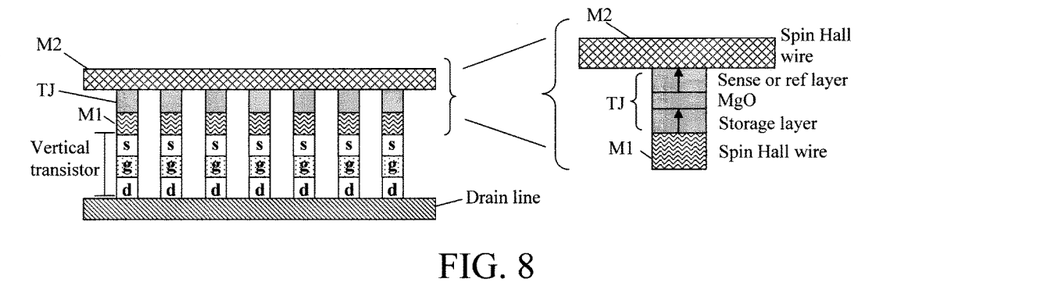
FIG. 8 is a cross-sectional view of the MRAM device having the spin hall wires above and below the tunnel junction according to an embodiment of the present invention.

As a solution, the present techniques employ a self reference read using two spin hall wires, one above and one below the tunnel junction. See FIG. 6 (top view), FIG. 7 (schematic side view), and FIG. 8 (cross-sectional view). As shown in FIGS. 6-8, the M1 metal lines serve as the spin hall wires below the TJs and the M2 metal lines serve as the spin hall wires above the TJs. It is notable that since the gate lines and the M1 metal lines overlap, these lines are shown at half width in FIG. 6 merely to be able to show both of their positions in a single top down view. Specifically, as shown in FIGS. 5-7 the vertical transistors are connected (in an offset manner) to the storage layer of the TJs via the M1 spin hall wires, and the M2 spin hall wires are connected to the sense layer (or reference layer) of the TJs. To write the sense layer (or reference layer), the M2 spin hall wires are connected to circuitry (not shown) on the edge of the array that can pass a write current through the entire M2 wire (all the way from one side of the array to the other).

Figure 9:
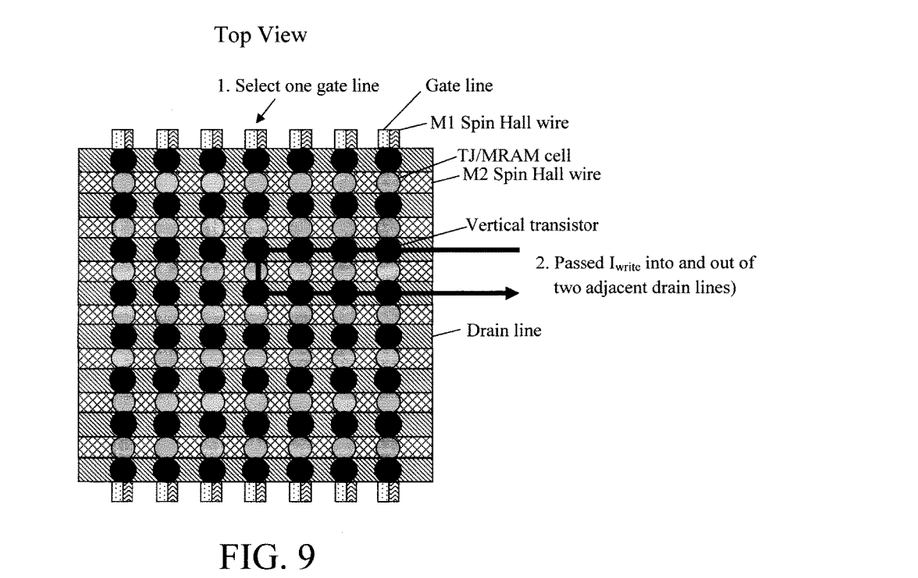
FIG. 9 is a diagram illustrating the spin hall wire below the tunnel junction being used to write the free layer according to an embodiment of the present invention.

The spin hall wire below the TJs (in this example the M1 metal line) is used to write the storage layer, using transistors to access only that device. See FIG. 9. Specifically, as shown in FIG. 9, the storage layer of a cell in the array is written by selecting one gate line (column) and passing a current $I_{write}$ into and out of two adjacent drain lines (rows). As with FIG. 6, the gate lines and the M1 metal lines (which overlap) are shown at half width in FIG. 9 so that both can be depicted in a single top down view. The spin hall effect from the M1 metal wire writes the storage layer of the TJ. The spin hall effect is used to generate a spin current in the M1 metal wire. A bipolar write can be achieved simply by reversing the current direction.

Generally, the electrical current that flows in the M1 metal wire under the TJ can have a horizontal component that can cause a spin current in the vertical direction to be generated due to the spin hall effect. The generated spin current is then injected into the storage layer of the TJ and exerts torque onto the magnetic moment of the storage layer. See, for example, U.S. Patent Application Publication Number 2014/0264511 by De Brosse et al., entitled "Spin Hall Effect Assisted Spin Transfer Torque Magnetic Random Access Memory," (hereinafter "U.S. Patent Application Publication Number 2014/0264511"), the contents of which are incorporated by reference as if fully set forth herein.

Using the M1 spin hall wire to write the storage layer, however, creates a mesh of interconnected devices, making it hard to read using conventional techniques. According to the present techniques, it has been found that a second spin hall wire (in this example the M2 metal lines above the TJs) can be used to write the sense layer during reading, allowing for a self reference read. Two reads are done, one before and one after applying the spin hall current. See, for example, methodology 1000 of FIG. 10. Thus, self referenced read methodology 1000 generally involves three cycles: Read/Write sense/Read. In general, the goal of the read process is to determine the magnetic orientation of the storage layer. The sense layer need not have good retention and, as provided above, is generally aligned parallel to the storage layer. Thus, if the sense layer starts out parallel to the storage layer, and during the self reference read is written (via spin hall current) to a specific orientation, either up or down (i.e., a specific known state), then comparing reads performed before and after applying the spin hall current can be used to determine the orientation of the storage layer (without ever disturbing the data in the storage layer). While this process will be described in detail below, a simple example is now given to illustrate the overall concept. Say for example that the storage layer has a magnetic orientation pointing down. The sense layer will align its orientation parallel to that of the storage layer, and thus too will point down. As provided above, this represents a low resistance state (storage and sense layers are oriented in parallel). The current read in the first phase will measure accordingly. If the sense layer is then written in the second phase to a known state (say pointing up), then the resistance through the TJ will change (i.e., to a high resistance since storage and sense layers are now oriented anti-parallel to one another). The current read in the third phase will thus be different from that in the first phase. By contrast, if the storage layer (and sense layer) were initially pointing up, then writing the sense layer using the same up current will not change the orientation of the sense layer (since it is already pointing up). Thus, the read current measured before (first phase) and after (third phase) the writing the sense layer (second phase) will not change. By way of example only, the former (parallel, low resistance) state might be assigned a logic 0 and the latter (anti-parallel, high resistance) state a logic 1.

Figure 10:
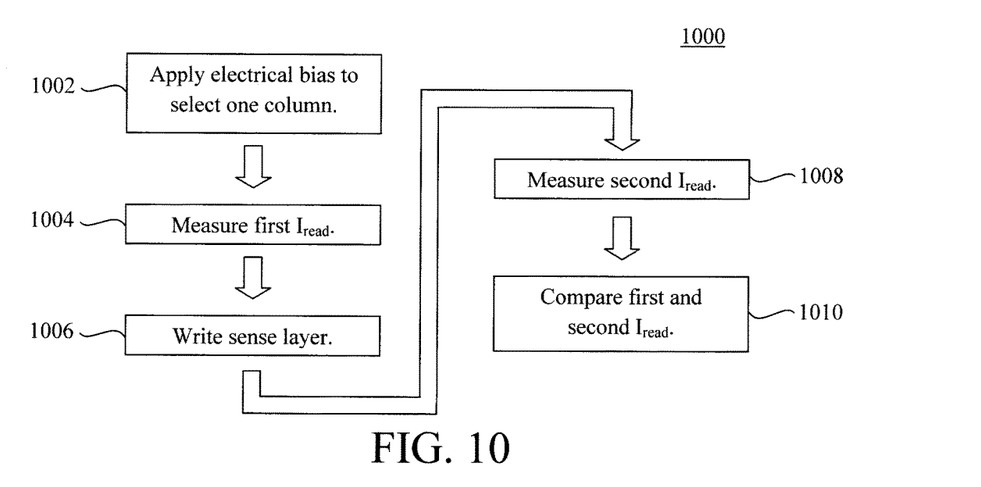
FIG. 10 is a diagram illustrating an exemplary methodology for performing a self reference read using two spin hall wires according to an embodiment of the present invention.
Figure 11:
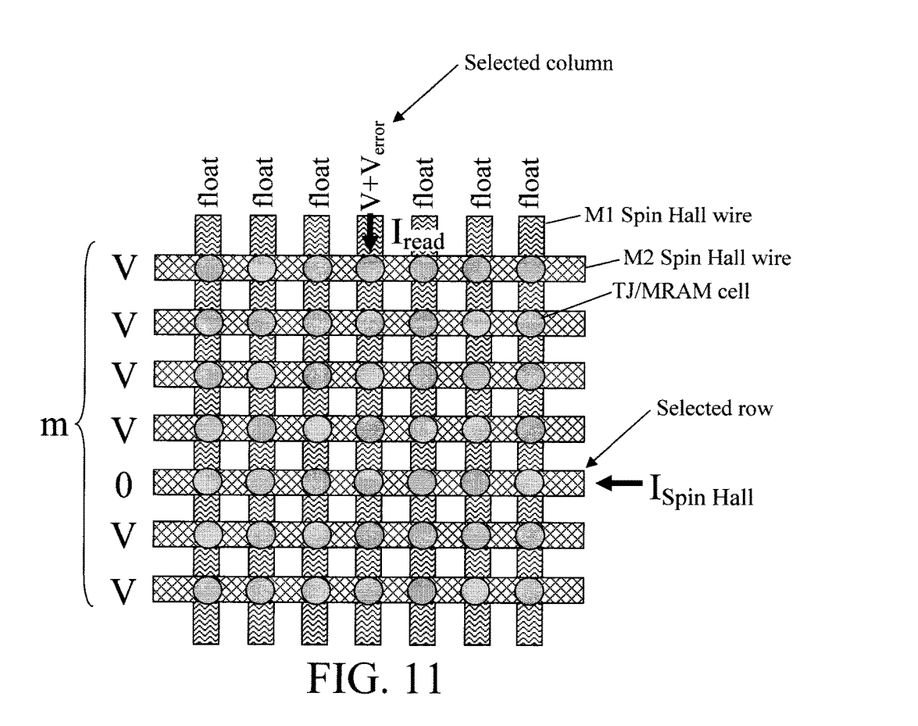
FIG. 11 is a diagram illustrating the methodology of FIG. 10 being performed on an exemplary MRAM device according to an embodiment of the present invention.

Thus, leading into methodology 1000 the storage layer will have a magnetic orientation pointing either up or down, and the sense layer will be aligned in parallel with the storage layer. It is unknown, however, whether the storage layer and sense layer both point up or down. In step 1002, an electrical bias is applied to the M1 metal line to select one column. According to an exemplary embodiment, in step 1002 a voltage V is applied to the M1 metal line of the selected column as well as to the M2 metal lines of all unselected rows. See, for example, FIG. 11 which shows the application of a bias voltage to the select column, and all unselected rows. A zero applied voltage is used for the corresponding selected row. As a result, a large current will be flowing through the TJ at the juncture of the selected column and selected row. In step 1004, a first instance of this read current ($I_{read}$) from the selected column is measured (which is the first Read cycle of the process). However, a small error voltage ($V_{error}$) will cause small currents to also flow through the other TJs along the selected row. See FIG. 11. This error voltage ($V_{error}$) is due to the inability in practice to get a circuit to apply exactly the same voltage everywhere. Because of this $V_{error}$, all m TJs on the column contribute to the read current ($I_{read}$) measured in step 1004:

$$I_{read} = \frac{V + V_{error}}{R_{target}} + \sum_{\substack{i=1 \\ i \neq target}}^{m} \frac{V_{error}}{R_i}$$

wherein m is the number of TJs on the column. Thus, the read performed in step 1004 is a 'reference' read, or a measurement against which a second read (following a sense layer write) will be compared to zero in on the exact TJ.

As described above, the dipole field from the storage layer aligns the sense layer with the storage layer. Thus, at this point in the process, the storage layer and the sense layer are in a parallel state. As also provided above, when the storage layer and the sense layer are in a parallel state, the resistance through the TJ is less than when the storage layer and the sense layer are in an anti-parallel state relative to one another. This notion is leveraged to, in step 1006, write the sense layers along the selected row using a spin hall current through the corresponding M2 metal line (which is the Write sense cycle of the process). See FIG. 11. According to an exemplary embodiment, step 1006 is performed to write the sense layers to a known state. For example, if an up current is always employed in step 1006, then the sense layers will be written to point up no matter what state they were in prior to the write, either pointing up or down. It is notable that the term "up current" (or "down current") as used herein refers to a current direction that results in the sense layers being written into the up state (or down state), not that the physical direction of the current is up (or down)—which it is not.

As noted above, at the outset the orientation of the storage layer and sense layer is unknown. For instance, the storage and sense layers can be aligned in parallel both pointing either up or down. If the storage and sense layers are both pointing down, then applying an up current will reverse the orientation of the sense layer, and thus will orient the sense layer anti-parallel to the storage layer—i.e., the storage layer has good retention and is not affected during the sense write (see above). On the other hand, if the storage and sense layers are both pointing up, then applying an up current will have no effect on the orientation of the sense layer. Thus, the sense layer will remain parallel to the storage layer. The first scenario can be assigned a 0 state, and the second scenario can be assigned a 1 state (or vice versa).

In step 1008, the read current ($I_{read}$) is measured again for the selected column (which is the second Read cycle of the process). In step 1010, $I_{read}$ measured in step 1004 (the reference measurement) is compared with the $I_{read}$ measured in step 1008 to determine whether the state of the TJ at the intersection of the select column and select row has changed. As provided above, if the storage and sense layers are aligned along the direction that the current applied in step 1006 will write the sense layer into, i.e., the storage and sense layers are pointing up and an up current is applied in step 1006, then the storage and sense layers will remain in a parallel state and the first $I_{read}$ (step 1004) and the second $I_{read}$ (step 1008) will be the same, there will be no change. On the other hand, if the storage and sense layers are aligned opposite to the direction that the current applied in step 1006 will write the sense layer into, then the sense layer will end up being anti-parallel to the storage layer, and the first $I_{read}$ (step 1004) and the second $I_{read}$ (step 1008) will be different. Namely, as described above, an anti-parallel configuration increases the resistance of the TJ. As a result, the read current will decrease, i.e., the first $I_{read}$ (step 1004) will be greater than the second $I_{read}$ (step 1008).

Notably, since the self reference read performed in methodology 1000 only affects the sense layer, the data in the storage layer is not disrupted. Further, since the spin hall effect is used to write the layers via the spin hall wires above and below the TJs, then there is no write current being passed through the tunnel barrier—thereby avoiding damage to the tunnel barrier.

Figure 12:
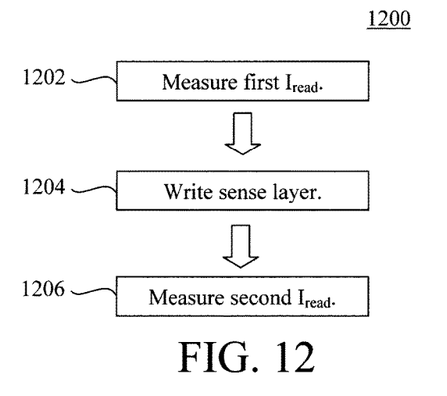
FIG. 12 is a diagram illustrating an exemplary methodology summarizing the self-reference read operations of the present MRAM devices according to an embodiment of the present invention.

Methodology 1200 of FIG. 12 summarizes the self reference read operations performed as described above. Methodology 1200 is performed in conjunction with an MRAM device having a spin hall wire below (e.g., the M1 metal wire) and a spin hall wire above (e.g., the M2 metal wire) the TJ. It is assumed that data has been previously written to the device (e.g., the storage layer is written using the spin hall wires below the TJs (e.g., the M1 metal wires).

As shown in FIG. 12, the self reference read is performed by: measuring a first $I_{read}$ in step 1202, writing the sense layer using the spin hall wires above the TJs (e.g., the M2 metal wires) in step 1204, and then measuring a second $I_{read}$ in step 1206.

While the examples above employ TJs with writable storage and sense layers, as provided above the present techniques can also be implemented using standard magnetic tunnel junctions having a "fixed" pinned reference ("ref") layer and a "free" storage layer separated by a tunnel barrier. See, for example, FIGS. 5 and 8, above. With a standard TJ, the spin hall current will be used to change the orientation of the storage layer during the present self reference read process. However, an extra step may be needed to write the free layer (back to its original state) in order to retain the information. By comparison, in methodology 1000 above the storage layer is not disrupted during the self reference read.

Figure 13:
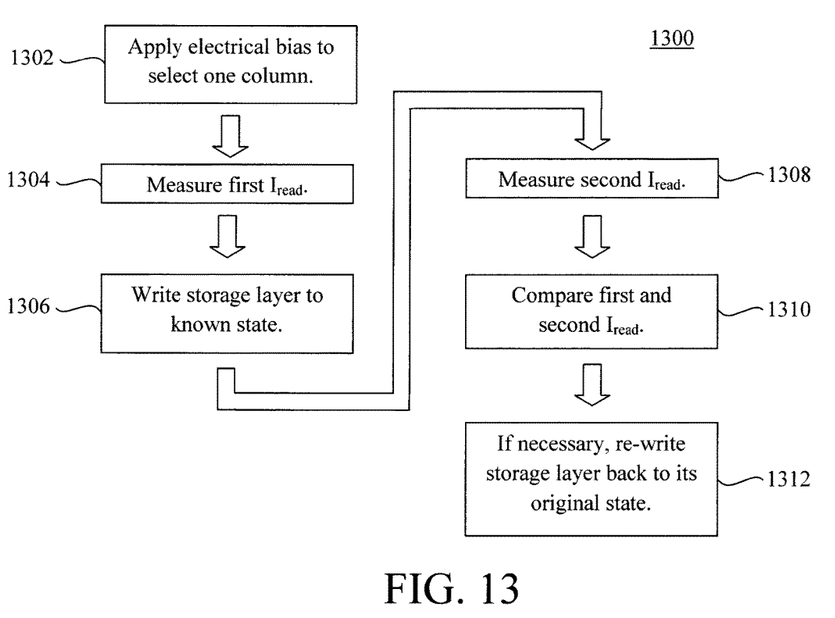
FIG. 13 is a diagram illustrating an exemplary methodology for performing a self reference read using two spin hall wires according to an embodiment of the present invention.

Methodology 1300 of FIG. 13 details the present self reference read process in the context of a standard magnetic tunnel junction. Methodology 1300 generally involves four cycles: Read/Write storage layer/Read/Write storage back (if necessary).

Leading into methodology 1300, the magnetic tunnel junction can be in one of two states, the storage layer is either aligned parallel or anti-parallel to the pinned reference layer. These are low and high resistance states, respectively. As above, in step 1302 an electrical bias is applied to the M1 metal line to select one column (e.g., by applying a voltage V to the M1 metal line of the selected column as well as to the M2 metal lines of all unselected rows). As described above, a small error voltage ($V_{error}$) will also cause small currents to flow through the other TJs along the selected row. A first measurement of $I_{read}$ is made in step 1304.

In the same manner as described above, in step 1306 a spin hall current through the M1 spin hall metal line is used to write the storage layer to a known state. For instance, an up current can be used to consistently write the storage layer to point upwards (regardless of whether the storage layer started out pointing up or down). A second measurement of $I_{read}$ is made in step 1308, and in step 1310 the first $I_{read}$ measurement is compared with the second $I_{read}$ measurement to determine whether the TJ at the intersection of the selected column and row has changed states. This comparison can reveal that the first $I_{read}$ measurement is either different or the same as (no change) the second $I_{read}$ measurement. For instance, changing the storage layer from being parallel to anti-parallel to the reference layer, or vice versa will increase/decrease resistance through the TJ. However, applying an up current when the storage layer is already pointing up will yield no change. An increase in resistance through the TJ will decrease the read current, i.e., the first $I_{read}$ will be greater than the second $I_{read}$, whereas a decrease in resistance through the TJ will increase the read current, i.e., the first $I_{read}$ will be less than the second $I_{read}$. This concept can be further illustrated using the following non-limiting example: say for instance that the reference layer is set up (permanently) and the storage layer is always written up during the self-reference read. This means that it always end up in the low resistance state on the second read. When comparing the first and second read currents, if the second read current is more than 30% larger than the first read current, then it can be known that there was a change to the low resistance state (i.e., it must have started out in the high resistance state) so it was a 1. On the other hand, if there is less than a 30% change (in the noise) then the state must have not changed, and hence was always in the low resistance state, and hence a 0.

If step 1310 reveals that there is a change between the first and second $I_{read}$, it indicates that the orientation of the storage layer has been changed, i.e., relative to the pinned reference layer. In that case, in order to retain the information stored in the magnetic memory cells it is necessary in step 1312 to re-write the storage layer back to its original state. As described above, this can be achieved via a spin hall current through the M1 spin hall metal line. For instance, if an up current was used during the self reference read, then a down current can be used to return the storage layer to its original state. By contrast, if step 1310 reveals that there is no change between the first and second $I_{read}$, then no rewriting is necessary since the storage layer remains in its original state.

Figure 14:
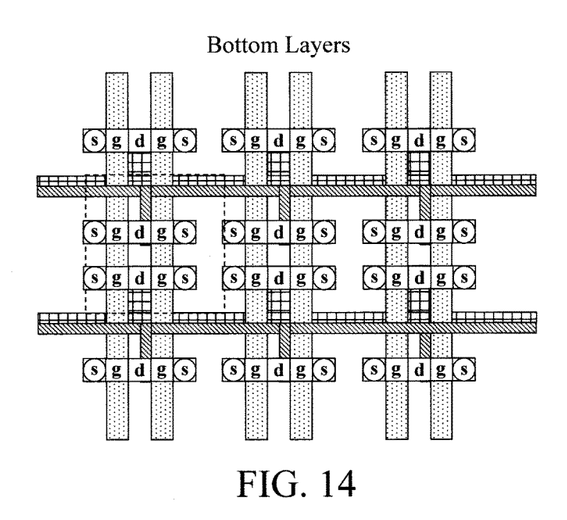
FIG. 14 is a top-down diagram illustrating transistors and bottom layers of another MRAM device according to an embodiment of the present invention.
Figure 15:
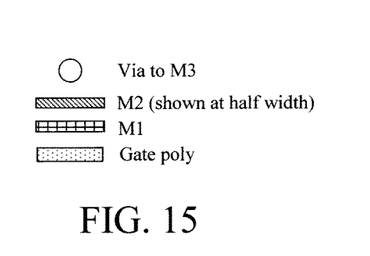
FIG. 15 provides a figure legend for the structures shown in FIG. 14 according to an embodiment of the present invention.
Figure 16:
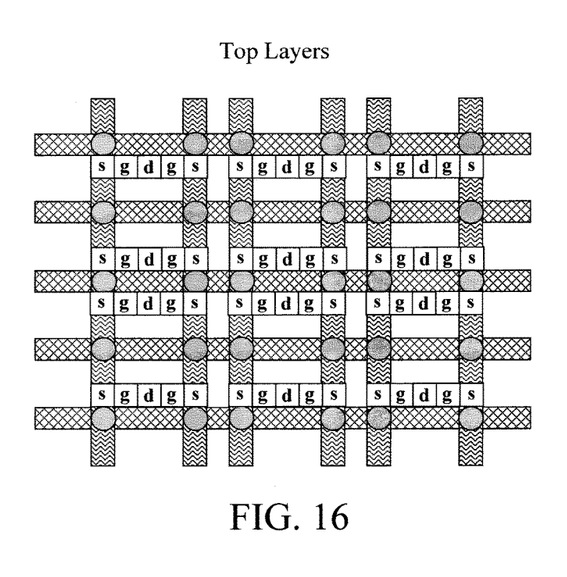
FIG. 16 is a top-down diagram illustrating transistors and top layers of the MRAM device according to an embodiment of the present invention.
Figure 17:
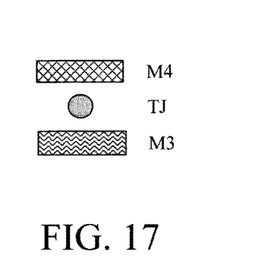
FIG. 17 provides a figure legend for the structures shown in FIG. 16 according to an embodiment of the present invention.

The present techniques can be implemented using a standard planar (as opposed to a vertical transistor) configuration. See, for example, FIGS. 14-17. Referring to FIGS. 14 and 15 (bottom layers) and FIGS. 16 and 17 (top layers) an exemplary MRAM device is shown which employs a planar transistor configuration. In this example, each magnetic memory cell contains two transistors next to one another which share a common drain, i.e., source (s), gate (g), drain (d). The gates of the transistors are accessed via a plurality of gate lines (labeled "gate poly"), and the sources are accessed (through vias) by M3 metal lines.

The general process for using the spin hall effect to write magnetic memory cells is described in U.S. Patent Application Publication Number 2014/0264511. The details of this process as they pertain to the present techniques are now provided. As described in detail above, the metal lines (M1 and M2) below and above the TJs can constitute spin hall wires that are used to write the storage and sense (or reference) layers of the TJs, respectively. In general the materials used in forming the (M1 and M2) spin hall wires can be any single element, compound, or alloy which has a large spin hall angle (e.g., greater than a threshold). By way of example only, the spin hall wires described herein may be formed from platinum (Pt), tantalum (Ta), tungsten (W), bismuth (Bi), and combinations (e.g., alloys) thereof.

Figure 18:
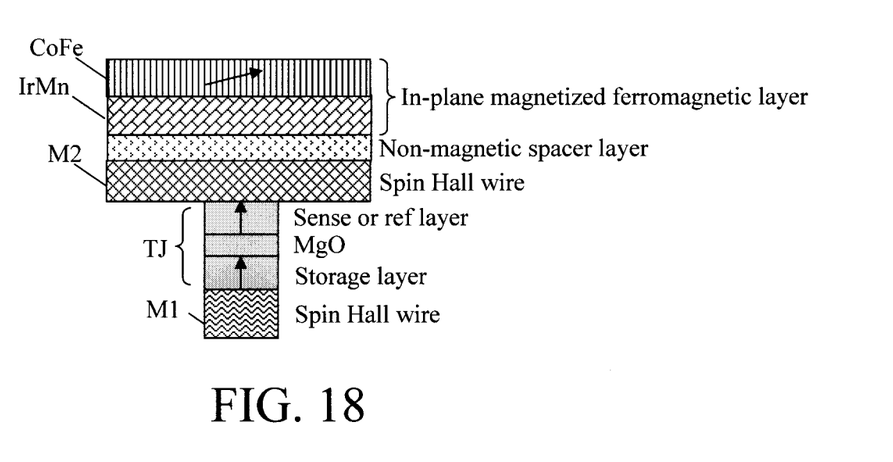
FIG. 18 is a schematic side view of in-plane magnetized ferromagnetic layer being included in the present tunnel junctions according to an embodiment of the present invention.

With regard to writing using the spin hall effect, an in-plane magnetic field may be necessary in order to obtain a deterministic switching polarity when the storage layer has perpendicular magnetic anisotropy. This in-plane magnetic field may be as small as about one hundred Oersted and can be provided by the dipole field from an in-plane magnetized ferromagnetic layer. See FIG. 18. As shown in FIG. 18, this in-plane magnetized ferromagnetic layer may be placed at the top of the TJ which is exchange-biased by an anti-ferromagnetic layer and separated from the sense layer by a nonmagnetic insulating spacer layer. Suitable materials for the in-plane magnetized ferromagnetic layer include, but are not limited to a combination of cobalt-iron (CoFe) and iridium-manganese (IrMn). See FIG. 18. According to an exemplary embodiment, the in-plane magnetized ferromagnetic layer is set at 45 degrees (as shown in FIG. 18) to provide this field for both the storage and sense layers, or is set into the page if using a reference layer. A suitable material for the nonmagnetic spacer layer includes, but is not limited to, MgO.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A magnetic random access memory (MRAM) device, comprising:
   a plurality of first spin hall wires oriented orthogonal to a plurality of second spin hall wires;
   a plurality of magnetic memory cells configured in an array between the first spin hall wires and the second spin hall wires;
   a plurality of transistors connected to the magnetic memory cells by the first spin hall wires; and
   a plurality of drain lines connected to the transistors, wherein the transistors comprise vertical transistors each having a drain connected to one of the drain lines, a gate on the drain, and a source on the gate.

2. The MRAM device of claim 1, wherein the source is connected to one of the first spin hall wires.

3. The MRAM device of claim 1, wherein at least one of the magnetic memory cells comprises:
   a storage layer;
   a sense layer; and
   a tunnel barrier separating the storage layer and the sense layer.

4. The MRAM device of claim 3, wherein one of the first spin hall wires is connected to the storage layer, and one of the second spin hall wires is connected to the sense layer.

5. The MRAM device of claim 1, wherein the transistors are offset from the magnetic memory cells.

6. The MRAM device of claim 1, wherein at least one of the magnetic memory cells comprises:
   a storage layer;
   a reference layer; and
   a tunnel barrier separating the storage layer and the reference layer.

7. The MRAM device of claim 6, wherein one of the first spin hall wires is connected to the storage layer.

8. A method of operating an MRAM device, comprising:
   providing the MRAM device having a plurality of first spin hall wires oriented orthogonal to a plurality of second spin hall wires, a plurality of magnetic memory cells configured in an array between the first spin hall wires and the second spin hall wires, and a plurality of transistors connected to the magnetic memory cells by the first spin hall wires, wherein the magnetic memory cells comprise storage layers, sense layers, and tunnel barriers separating the storage layers and the sense layers;
   applying an electrical bias to one of the first spin hall wires to select a given column of the array;
   measuring, at a first instance, a read current from the selected column;
   writing the sense layers of the magnetic memory cells in a given row of the array to a known state by applying a spin hall current to one of the second spin hall wires;
   measuring, at a second instance after the writing step, the read current from the selected column; and
   comparing the read current measured at the first instance and at the second instance to determine whether a given one of the magnetic memory cells at an intersection of the selected column and the selected row has changed states.

9. The method of claim 8, wherein the applying step comprises:
   applying a voltage V to both the given column of the array and to all but the selected row.

10. The method of claim 8, further comprising the steps of:
- selecting at least one of the magnetic memory cells using the transistors; and
- writing the storage layers of the at least one magnetic memory cells by applying a spin hall current to at least one of the first spin hall wires.

11. The method of claim 8, wherein the MRAM device further comprises a plurality of drain lines connected to the transistors.

12. The method of claim 11, wherein the transistors comprise vertical transistors each having a drain connected to one of the drain lines, a gate on the drain, and a source on the gate.

13. The method of claim 12, wherein the source is connected to one of the first spin hall wires.

14. The method of claim 8, wherein the first spin hall wires are connected to the storage layers, and the second spin hall wires are connected to the sense layers.

15. The method of claim 8, wherein the transistors are offset from the magnetic memory cells.

16. A method of operating an MRAM device, comprising:
- providing the MRAM device having a plurality of first spin hall wires oriented orthogonal to a plurality of second spin hall wires, a plurality of magnetic memory cells configured in an array between the first spin hall wires and the second spin hall wires, and a plurality of transistors connected to the magnetic memory cells by the first spin hall wires, wherein the magnetic memory cells comprise storage layers, reference layers, and tunnel barriers separating the storage layers and the reference layers;
- applying an electrical bias to one of the first spin hall wires to select a given column of the array;
- measuring, at a first instance, a read current from the selected column;
- writing the storage layers of the magnetic memory cells in a given row of the array to a known state by applying a spin hall current to one of the first spin hall wires;
- measuring, at a second instance after the writing step, the read current from the selected column;
- comparing the read current measured at the first instance and at the second instance to determine whether a given one of the magnetic memory cells at an intersection of the selected column and the selected row has changed states; and
- rewriting the given magnetic memory cell back to an original state if the given magnetic memory cell has changed states.

17. The method of claim 16, wherein the transistors comprise vertical transistors.

18. The method of claim 16, wherein the first spin hall wires are connected to the storage layers.

* * * * *